(12) United States Patent
Gomes

(10) Patent No.: US 6,557,133 B1
(45) Date of Patent: Apr. 29, 2003

(54) SCALING LOGIC FOR EVENT BASED TEST SYSTEM

(75) Inventor: Glen A. Gomes, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/286,226

(22) Filed: Apr. 5, 1999

(51) Int. Cl.[7] .......................... G01R 31/28; G06F 11/00
(52) U.S. Cl. ...................................... 714/738
(58) Field of Search ............................ 714/724, 799, 714/25, 718, 738, 32, 33, 39; 702/119, 79, 85; 716/4; 703/17; 324/73.1, 189.07; 365/201

(56) References Cited

U.S. PATENT DOCUMENTS 6,226,765 B1 * 5/2001 Le et al. .................... 365/201

* cited by examiner

Primary Examiner—Albert Decady
Assistant Examiner—Guy Lamarre
(74) Attorney, Agent, or Firm—Muramatsu & Associates

(57) ABSTRACT

An event based test system having a scaling function for freely changing the timings of events for generating test signals for testing an electronics device under test (DUT) in proportion to a scale factor. The event based test system includes an event memory for storing timing data of each event formed with an integer multiple of a reference clock period and a fraction of the reference clock period wherein the timing data represents a time difference between two adjacent events, an address sequencer for generating address data for accessing the event memory, a summing and scaling logic for summing the timing data and modifying the timing data based on the scale factor to produce an overall time of each event relative to a predetermined reference point, and an event generator for generating each event based on the overall time.

17 Claims, 14 Drawing Sheets

SCALING LOGIC FOR EVENT BASED TEST SYSTEM

FIELD OF THE INVENTION

This invention relates to a semiconductor test system for testing semiconductor devices, and more particularly, to a scaling logic to be used in an event based semiconductor test system for generating various test events including test signals and strobe signals of various timings to evaluate a semiconductor device under test wherein the timing of each of the events is defined by a time length from the previous event.

BACKGROUND OF THE INVENTION

In testing semiconductor devices such as ICs and LSIs by a semiconductor test system, such as an IC tester, a semiconductor IC device to be tested is provided with test signals produced by an IC tester at its appropriate pins at predetermined test timings. The IC tester receives output signals from the IC device under test generated in response to the test signals. The output signals are strobed, i.e., sampled by strobe signals with predetermined timings to be compared with expected data to determine whether the IC device functions correctly.

Traditionally, timings of the test signals and strobe signals are defined relative to a tester rate or a tester cycle of the semiconductor test system. Such a test system is sometimes called a cycle based test system. In a cycle based test system, the semiconductor device under test (DUT) is tested by providing cycled pin pattern vectors at a programmed data rate (tester cycle) to a formatter with timing edges to produce the desired waveforms of the test signals and the strobe signals.

Various timings of the tester cycles, test signals and strobe signals noted above are generated based on a reference clock. The reference clock is produced by a high stability oscillator, for example, a crystal oscillator provided in the IC tester. When the required timing resolution in an IC tester is equal to or an integer multiple of the highest clock rate (shortest clock cycle) of the reference clock oscillator, variety of timing signals can be generated by simply dividing the reference clock by a counter or a divider.

However, IC testers are usually required to have timing resolution higher than the highest clock rate, i.e., the shortest time period, of the reference (system) clock. For example, in the case where a reference clock used in an IC tester is 10 ns (nanosecond), but the IC tester needs to have timing resolution of 0.3 ns or higher, it is not possible to achieve such timing resolution by simply applying or dividing the reference clock. Furthermore, the IC testers today are required to dynamically change such various timings in a cycle by cycle basis based on a test program.

To generate such timing signals, it is known in the prior art that such timings are described by timing data in a test program. For describing the timings with the resolution higher than the reference clock rate, the timing data is described by a combination of an integer multiple of the reference clock time interval (integral part) and a fraction of the reference clock cycle (fractional part). Such timing data is stored in a timing memory and read out at each cycle of the test cycle. Thus, in each test cycle, test signals and strobe signals are generated with reference to the test cycle, such as a start point of each cycle, based on the timing data.

There is another type of test system called an event based test system wherein the desired test signals and strobe signals are produced by data from an event memory directly on a per pin basis. As of today, an event based test system is not commercialized in the market but is still under the feasibility study. The present invention is mainly directed to such an event based test system.

In an event based test system, notion of events is employed, which is any changes of the logic state in signals to be used for testing a semiconductor device under test. For example, such changes are rising and falling of test signals and strobe signals. The timings of the events are defined with respect to a time length from a reference time point. Typically, such reference time points are timings of the previous events.

For producing high resolution timings, the time length (delay value) between the events is defined by a combination of an integer multiple of a reference clock cycle (integer part or event count) and a fraction of the reference clock cycle (fractional part or event vernier). A timing relationship between the event count and the event vernier is shown in timing charts of FIG. 2. In this example, a reference clock (master clock or system clock) of FIG. 2A has a clock cycle (period or time interval) T. Timings of Event 0, Event 1 and Event 2 of FIG. 2C are related as shown in FIGS. 2A–2C. To describe Event 1 with reference to Event 0, the timing relationship of FIG. 2B is used in which NT denotes the event count which is N times of the reference clock period T and $\Delta T$ denotes the event vernier which is a fraction of the reference clock period T.

In an event based test system, since the timing data in a timing memory (event memory) does not need to include complicated information regarding each and every test cycle data, the description of the timing data can be dramatically simplified. In the event based test system, the timing data for each event stored in an event memory is expressed by a time difference between the current event and the last event. Since such a time difference between the adjacent events is very small, a size of the data in the memory can also be small, resulting in the reduction of the memory capacity.

Moreover, in computer aided design (CAD) systems widely used today for designing a semiconductor device such as an LSI and VLSI, a logic simulator in the CAD system utilizes event based test signals for evaluating the semiconductor device. Therefore, an event based test system shows a better linking ability between the design data produced by the CAD system in the design stage and the test signals to be generated using the design data.

As noted above, in an event based test system, the event data in the event memory is expressed by a time difference (delta time) between the current event and the previous event. Thus, to produce events based upon the event data, an event based test system must be able to calculate the sum of the delays up to each event. This requires a logic in the test system to keep counting of the delay times expressed in the event count and to sum the event vernier values.

Such a relationship is shown in a timing chart of FIG. 3 in which Events 0–7 are expressed with reference to the reference clock having a time interval T=1. For example, a delta time $\Delta V_0$ for Event 0 may be 0.75 (event count "0", and event vernier "0.75"), and a delta time $\Delta V_1$ for Event 1 may be 1.50 (event count "1", and event vernier "0.50"). In this situation, the total delay of Event 1 will be 2.25 where a logic in the test system counts two event clocks "2.0" and calculates sum of event vernier "0.25" as the remaining fractional delay. This summing operation is essential for calculating the correct vernier during each event involved in a test signal.

An event test system must also be able to scale the delta times from the event memory. The scaling operation of the delta times $\Delta V_0, \Delta V_1 \ldots \Delta V_n$ consists of multiplying each delta time by a scaling factor. For example, to scale a delta time of "1.5" by a scale factor of "2" means that 1.5×2=3.0. Generally, for the delta time (delay value) defined by the event count and event vernier as above, this multiplication would consist of (event count+event vernier)×(Scale factor)=Scaled delay.

Software can perform the above noted operations of summing and scaling. However, the time required to transform a large data base of delays, as well as, the time to reload this data into an event based tester may be prohibitive. Rather, the summing and scaling operation may be implemented directly by hardware. A variety of scaling technologies may be feasible in the event based test system.

SUMMARY OF THE INVENTION

It is an object of the present invention to provide an event based semiconductor test system for producing test signals and strobes based on event data stored in an event memory to evaluate a semiconductor device.

It is another object of the present invention to provide an event based semiconductor test system for producing events of various timings wherein the timing of each of the events is defined by a time length (delta time) from the last event.

It is a further object of the present invention to provide an event based semiconductor test system for producing events based on delta times from previous events, each of which is defined by a combination of an integer multiple of a reference clock period and a fraction of the reference clock period.

It is a further object of the present invention to provide an event based semiconductor test system which is capable of scaling the delay times (delta times) for producing the current events by modifying the delay times of the current events based on a scaling factor.

It is a further object of the present invention to provide an event based semiconductor test system which is capable of scaling the delay times (delta times) based on a scale factor having both an integer component and a fractional component.

It is a further object of the present invention to provide an event based semiconductor test system which is capable of scaling the delay times (delta times) based on a scale factor having only an integer component.

The present invention is an event based test system for testing an electronics device under test (DUT) by producing events of various timings for supplying a test signal to the DUT and evaluating an output of the DUT at a timing of a strobe signal. The timings of the events can be freely scaled in response to the value of a scale factor.

The event based test system includes: an event memory for storing timing data of each event formed with an integer multiple of a reference clock period (integral part data) and a fraction of the reference clock period (fractional part data) wherein the timing data represents a time difference between two adjacent events, an address sequencer for generating address data for accessing the event memory to read out the timing data therefrom, a summing and scaling logic for summing the timing data and modifying the timing data based on a scale factor to produce an overall time of each event relative to a predetermined reference point wherein the summing and scaling logic includes a delay means for providing an additional delay of one reference clock period every time when a sum of the fractional part exceeds the reference clock period, an event generator for generating each event based on the overall time for formulating the test signal or strobe signal, and a host computer for controlling an overall operation of the event based test system through a test program.

In another aspect of the present invention, the summing and scaling logic includes an event count scaling logic for scaling the event count data based on the scale factor, an event vernier scaling logic for scaling the vernier data from the event vernier memory based on the scale factor, an event count state machine for producing an output signal in response to a terminal count pulse from the event count scaling logic, and an event scaling output logic for calculating an overall scaled delay of a current event based on scaled data from the event count scaling logic, scaled data from the vernier scaling logic and the output signal from the event count state machine.

In the summing and scaling logic, the scale factor for scaling the timing data includes an integer component and a fractional component. Alternatively, the scale factor for scaling the timing data includes only an integer component. In the aspect of present invention where the scale factor includes both an integer component and a fractional component, the event count scaling logic is comprised of a scaling counter which is provided with the integer component of the scale factor for counting the reference clock for the number of times specified by the integer component of scale factor and generating a terminal count pulse every time when counting the specified number of the reference clock, and an accumulator which is provided with the fractional component of the scale factor for accumulating the fractional component every time when receiving the terminal count pulse from the scaling counter, wherein a carry signal is produced by the accumulator when the accumulated data exceeds one cycle length of the reference clock for providing an additional delay of one reference clock cycle to the scaling counter for counting the reference clock.

In the aspect of present invention where the scale factor includes both an integer component and a fractional component, the event vernier scaling logic is comprised of a multiplier which is provided with the vernier data from the event vernier memory for multiplying the same by the scale factor having both the integer component and the fractional component, and the event scaling output logic is comprised of an adder for summing the accumulated data from the accumulator in the event count scaling logic and the multiplied data from the multiplier in the event vernier scaling logic, and a state machine which is provided with the output signal from the event count state machine for producing an event start signal for the event generator, wherein a carry signal is produced by the adder when the summed data exceeds one cycle length of the reference clock for providing an additional delay of one reference clock cycle to the state machine in generating the event start signal.

In the further aspect of the present invention, the event vernier scaling logic includes a multiplier which is provided with the vernier data from the event vernier memory for multiplying the same by the scale factor having both the integer component and the fractional component, and a vernier accumulator for accumulating the vernier data at the timing of the reference clock for a specified number of times defined by the integer component of the scale factor. Since the multiplier deals with only the fractional component of the scale factor, an associated logic scale can be decreased.

According to the present invention, the event based semiconductor test system is capable of producing the events of various timings based on the event data stored in the event memory to evaluate the semiconductor device. The timing of each of the events is defined by a time length (delta time) from the last event. The delta time between events is described by a combination of an integer multiple of a reference clock period and a fraction of the reference clock period. The event test system of the present invention is capable of scaling the delay times (delta times) for producing the current events by modifying the delay times of the current events based on a scale factor. The scaling operation in the event test system of the present invention is performed based on the scale factor having both an integer component and a fractional component. In another aspect, the scaling operation in the event test system is performed based on the scale factor having only an integer component.

DETAILED DESCRIPTION OF THE PREFERRED EMBODIMENT

Figure 1:
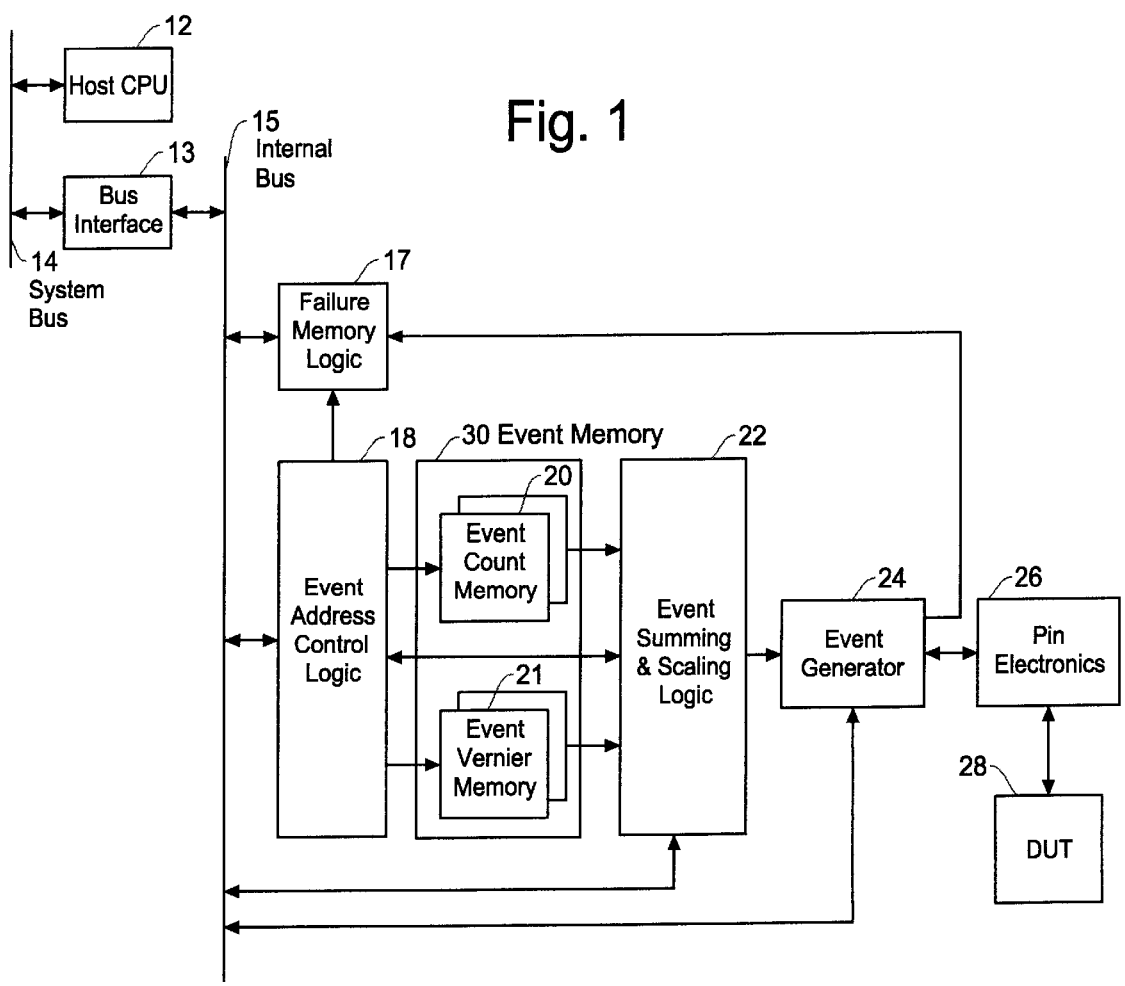
FIG. 1 is a schematic block diagram showing a basic structure of an event based test system of the present invention.
Figure 2:
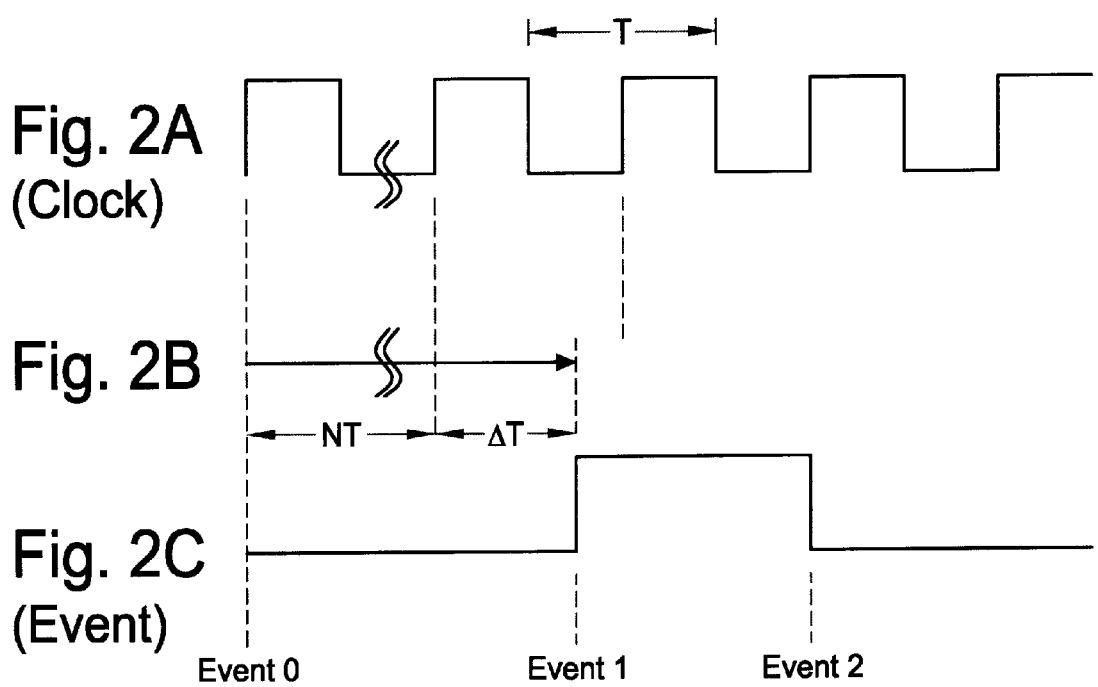
FIG. 2 is a timing diagram showing a basic timing relationship between the event count and the event vernier for describing a delay time (delta time) between two adjacent events.
Figure 3:
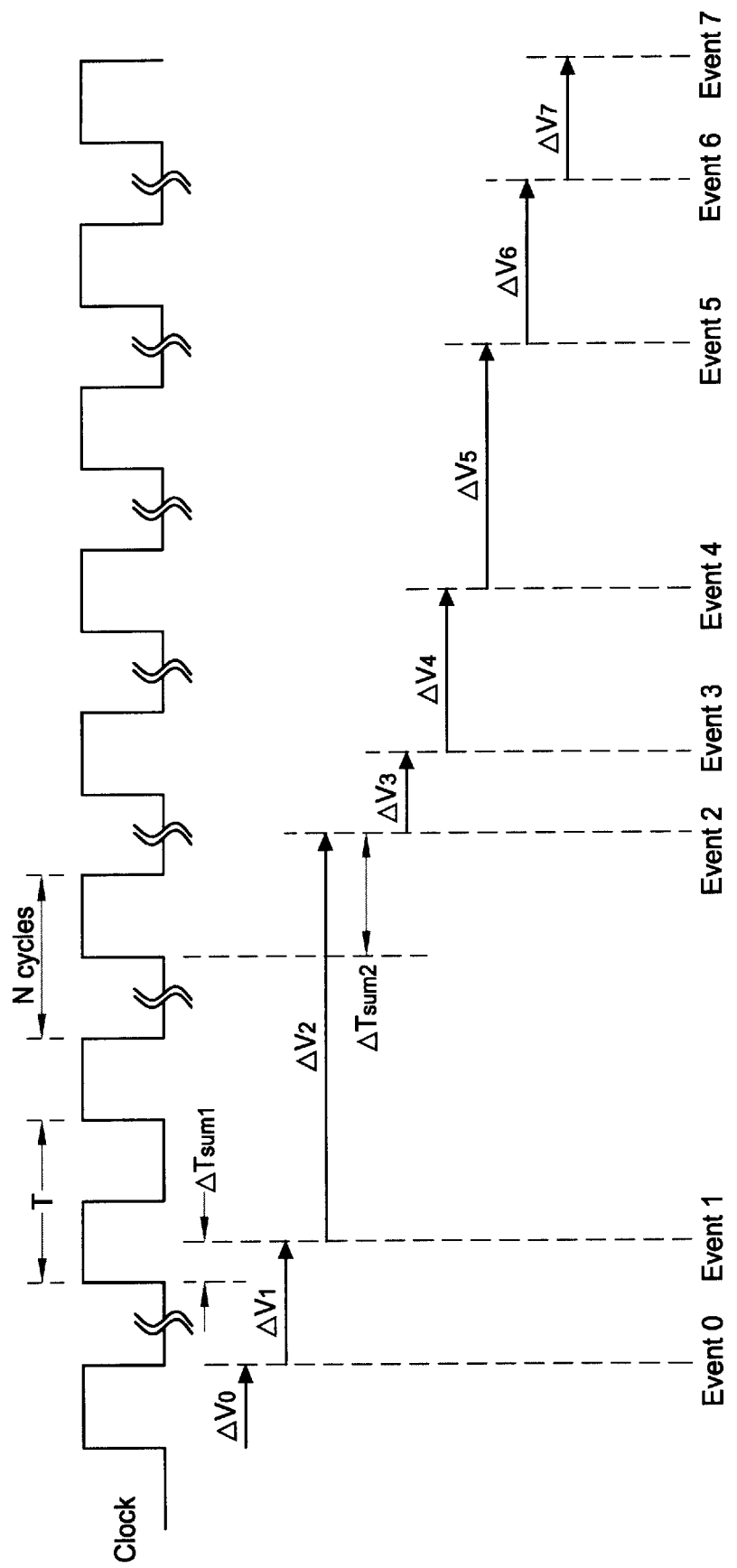
FIG. 3 is a timing chart showing timing relationships among various events relative to a reference clock for showing the concept of an event summing and scaling operation in an event test system.

FIG. 1 is a schematic block diagram showing an example of basic structure in an event based test system of the present invention. The event based test system includes a host computer 12 and a bus interface 13 both are connected to a system bus 14, an internal bus 15, an address control logic 18, a failure memory 17, an event memory 30 consists of an event count memory 20 and an event vernier memory 21, an event summing and scaling logic 22, an event generator 24, and a pin electronics 26. The event based test system is to evaluate a semiconductor device under test (DUT) 28, which is typically a memory IC or a logic IC such as a microprocessor, connected to the pin electronics 26.

An example of the host computer 12 is a work station having a UNIX operating system therein. The host computer 12 functions as a user interface to enable a user to instruct the start and stop operation of the test, to load a test program and other test conditions, or to perform test result analysis in the host computer. The host computer 12 interfaces with a hardware test system through the system bus 14 and the bus interface 13. Although not shown, the host computer 12 is preferably connected to a communication network to send or receive test information from other test systems or computer networks.

The internal bus 15 is a bus in the hardware test system and is commonly connected to most of the functional blocks such as the address control logic 18, failure memory 17, event summing and scaling logic 22, and event generator 24. An example of the address control logic 18 is a tester processor which is exclusive to the hardware test system and is not accessible by a user. The address control logic 18 provides instructions to other functional blocks in the test system based on the test program and conditions from the host computer 12. The failure memory 17 stores test results, such as failure information of the DUT 28, in the addresses defined by the address control logic 18. The information stored in the failure memory 17 is used in the failure analysis stage of the device under test.

The address control logic 18 provides address data to the event count memory 20 and the event vernier memory 21 as shown in FIG. 1. In an actual test system, a plurality of sets of event count memory and event vernier memory will be provided, each set of which may correspond to a test pin of the test system. The event count and vernier memories store the timing data for each event of the test signals and strobe signals. As will be described in more detail later, the event count memory 20 stores the timing data which is an integer multiple of the reference clock (integral part), and the event vernier memory 21 stores timing data which is a fraction of the reference clock (fractional part). In the context of the present invention, the timing data for each event is expressed by a time difference (delay time or delta time) from the previous event, which will also be described in more detail later.

The event summing and scaling logic 22 is to produce data showing overall timing of each event based on the delta timing data from the event count memory 20 and event vernier memory 21. Basically, such overall timing data is produced by summing the integer multiple data and the fractional data. During the process of summing the timing data, a carry over operation of the fractional data (offset to the integer data) is also conducted in the timing count and scaling logic 22. Further during the process of producing the overall timing, timing data may be modified by a scaling factor so that the overall timing be modified accordingly. The more details of such operations will be described later.

The event generator 24 is to actually generate the events based on the overall timing data from the event summing and scaling logic 22. The events (test signals and strobe signals) thus generated are provided to the DUT 28 through the pin electronics 26. Basically, the pin electronics 26 is formed of a large number of components, each of which includes a driver and a comparator as well as switches to establish input and output relationships with respect to the DUT 28.

The specific examples of the summing and scaling logic 22 will be described with reference to FIGS. 4–15. The summing operation is to sum all of the event data (delta times) received. The summing operation also involves a carry over when the sum of the fractional part of data exceeds a one cycle time length of the reference clock. The scaling is a process of multiplying the delay data (delta time) stored in the event memory by a scale factor. By changing the scale factor, timings (final delay values) of events generated by the test system can be freely modified. The major portion of the remaining descriptions is focused on the configuration and operation of the event scaling in accordance with the present invention.

There are two basic types of scaling, fractional scaling and integer scaling. In the fractional scaling, a scale factor contains a fractional component as well as an integer component, i.e., expressed as "xxx.xxx". In the integer scaling, a scale factor does not contain a fractional component but only an integer component, i.e., expressed as "xxx". Within the context of the present invention, it is required that the delta time between two adjacent events must be greater than one reference clock cycle.

Figure 4:
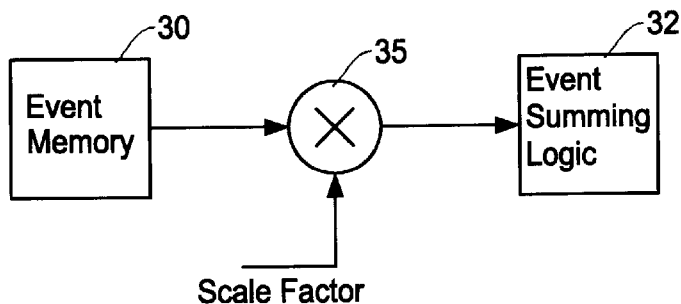
FIG. 4 is a schematic block diagram showing a basic structure of a pre-scaling in which a scaling function is provided prior to a summing function in accordance with the present invention.

The scaling can be performed either prior to the summing operation (pre-scaling) of the event data or after the summing operation (post-scaling). FIG. 4 is a schematic block diagram showing a basic structure of a pre-scaling in which the scaling function is provided prior to the summing function. The event data (delta time) from an event memory 30 is multiplied by the scale factor by a multiplier 35 before being provided to an event summing logic 32.

Figure 5:
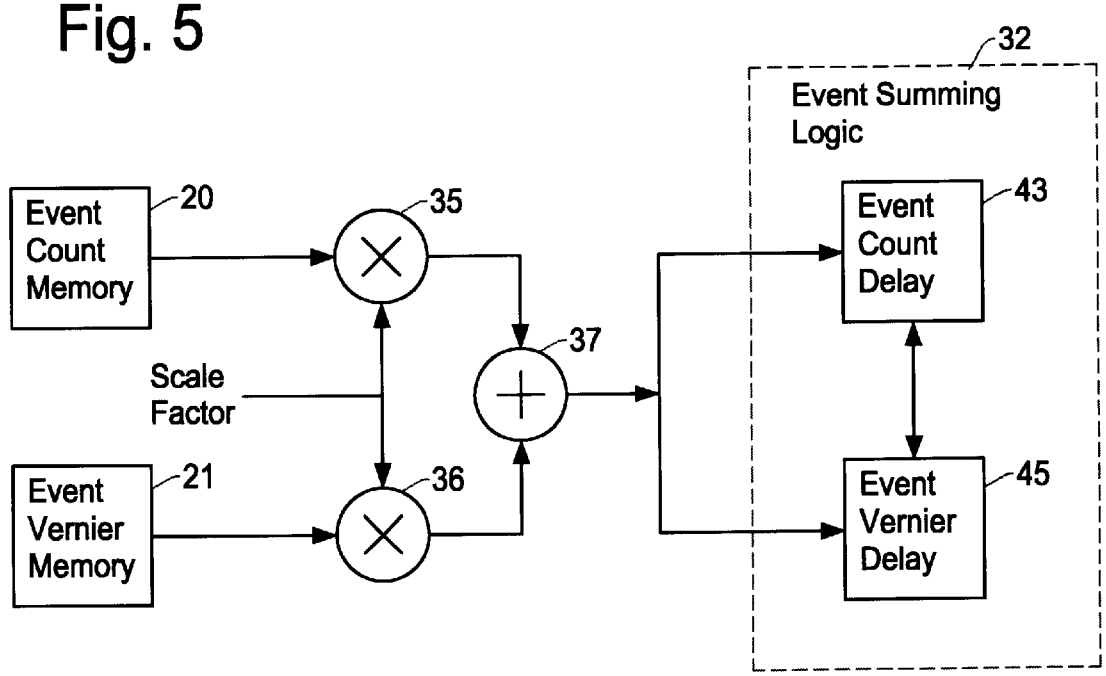
FIG. 5 is a schematic block diagram showing an example of circuit structure for performing either an integer pre-scaling or a fractional pre-scaling in the present invention.

The delay calculation (scaling) of FIG. 4 is applied to the event test system outlined earlier as shown in FIG. 5. FIG. 5 is a schematic block diagram showing an example of an integer pre-scaling or a fractional pre-scaling. The integral part of the delta time (event count data) from the event count memory 20 is scaled by a multiplier 35 which is provided with a scale factor. The fractional part of the delta time (vernier data) from the vernier memory 21 is scaled by a multiplier 36 which is provided with the scale factor.

The scaled delta times from the multipliers 35 and 36 are summed together; by an adder 37. This creates the final delay value which must then be separated into an integral part delay which is an integer multiple of the reference clock period (one cycle time) and a fractional part delay which is less than one reference clock period. The integral part delay is provided to an event count delay logic 43 while the fractional part delay is provided to an event vernier delay logic 45 in the summing logic 32. In the case where the result of the vernier scaling exceeds one reference clock cycle, an integral number in the result of the vernier scaling must be added to the integral part delay by the event count delay logic 43.

In the event summing logic 32, the event count delay logic 43 and the event vernier delay logic 45 interact to produce an overall delay time of the current event which is accumulated from the start of the operation. When the sum of the fractional part delays produces an overflow, the event vernier delay logic 45 signals the event count delay logic 43, thereby requiring the event count delay logic 43 to add an additional reference clock of delay.

The basic structure of an event test system with an integer pre-scaling is basically the same as that shown in FIG. 5 although the inner operation is different. The main difference comes from the fact that both the event count value from the event count memory 20 and the scale factor are integer numbers of the reference clock. Thus, scaling an integer value by another integer value produces no fractional components to be summed to the result of the event vernier delay. In contrast, the event vernier delay is a value less than one reference clock cycle in length. Thus, scaling this value with an integer scale factor may still produce a result with a fractional component. Moreover, the resultant delay may exceed one reference clock cycle in length. Thus, similar to the case of the fractional scaling, an integral number in the result of the vernier scaling must be added to the integral part delay to be provided to the event summing logic 32. Such a separation function is performed for the output of the adder 37 when separating the integral part delay and fractional part delay.

The pre-scaling noted above, compared with the post-scaling described later, has several disadvantages. First, the multiplication of each delay requires the fractional part of the result to be rounded to a given number of significant bits, which will introduce error in each delay (vernier delay). Secondly, since the results of the scaling operation will be summed by the event summing logic, the running sum of the scaled vernier delay data will accumulate these errors. Since the timing of the current event is a result of accumulating the delay times of all of the previous events, an error noted above ever increases as each new event (delay value) is added to the last sum.

Figure 6:
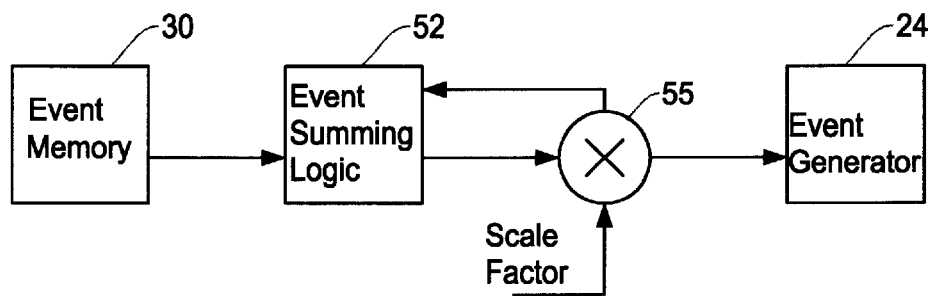
FIG. 6 is a schematic diagram showing a basic structure of a post-scaling in which a scaling function is provided after a summing function in accordance with the present invention.

To avoid the errors introduced by the pre-scaling operation above, the scaling operation should be placed after the summation of the vernier delay (fractional part) data. FIG. 6 shows a basic structure of the post-scaling scheme of the present invention in which the summing operation precedes the scaling operation. The multiplication of the delay data with a scale factor will still introduce errors, however, the error arises only one time and is not accumulated in the following events.

In FIG. 6, the delta time (delay data formed with an integral part and a fractional part) is provided to the event summing logic 52 where the delay data for the current event is summed to the delay data of all the previous events. The summed delay data is multiplied by the scale factor in the multiplier 55. The scaled delay data is provided to the event generator 24 which generates an event based on, for example, an event start (event enable) signal which is a final event count delay and an event vernier which is a final vernier delay. The block diagram of FIG. 6 also shows that the post-scaling logic must pass the data back to the event summing logic 52. This data represents the additional delay (over flow) introduced by the scaling operation, and acts to delay the summing logic accordingly.

Figure 7:
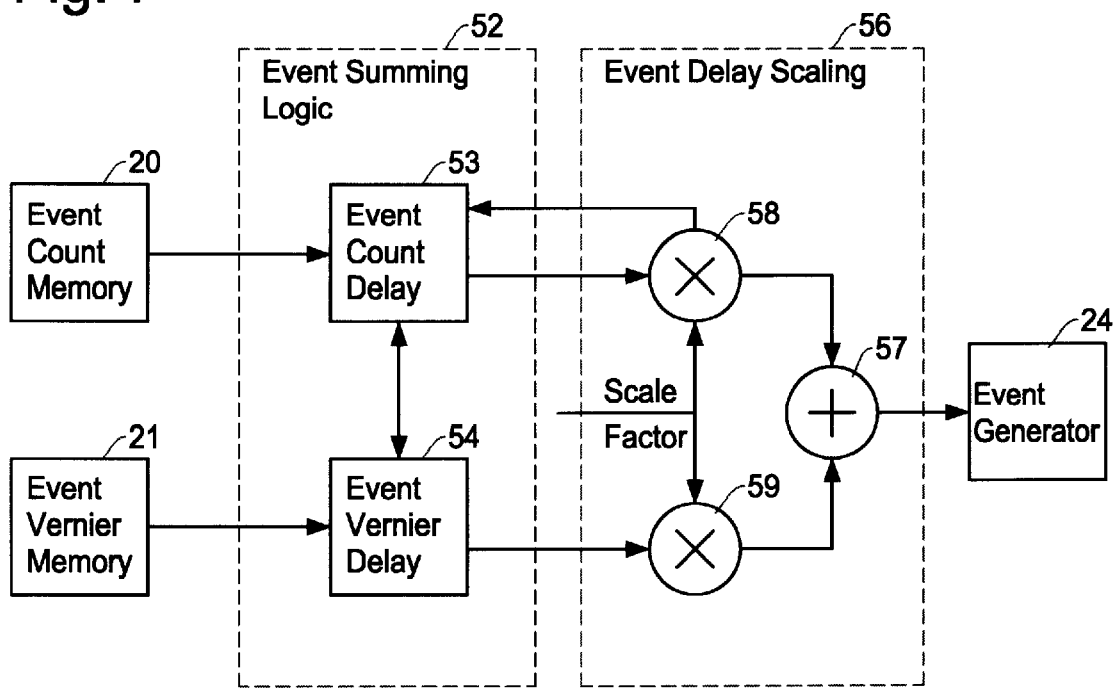
FIG. 7 is a schematic block diagram showing an example of circuit structure of a fractional post-scaling applied in an event test system in which a scale factor includes both an integer component and a fractional component.

FIG. 7 is a block diagram showing a basic structure of the post-scaling as applied in an event test system. In this example, the scale factor for multiplication contains both integer and fractional components. The event count data (integral part of delta time) from the event count memory 20 is provided to an event count delay logic 53 in an event summing logic 52. The event vernier data (fractional part of delta time) from the event vernier memory 21 is provided to an event vernier delay logic 54 in the event summing logic 52. In the event summing logic 52, the delta time of the current event is summed to the delta times of all of the previous events. During the course of this summing operation, every time when the result of summing the vernier data exceeds one reference clock cycle, a carry signal is produced to include an additional delay of one reference clock cycle in the event count delay 53.

A multiplier 58 receives the resultant integral delay value from the event count delay logic 53. The integral delay value is multiplied by the scale factor in the multiplier 58. A multiplier 59 receives the resultant vernier delay value from the event vernier delay logic 54. The vernier delay value is multiplied by the scale factor in the multiplier 59. The scaled results from both the multipliers 58 and 59 are added by the adder 57. The fractional component of the scale factor may produce a scaled event count delay with a fractional component. This fractional component must be added to the scaled vernier delay in order to determine the final delay value for the current event. In the case where the addition of the fractional parts results in the delay value greater than one event clock cycle (overflow), the integer part of the output of the adder 57 must be added a delay time which is one cycle of the reference clock.

Figure 8:
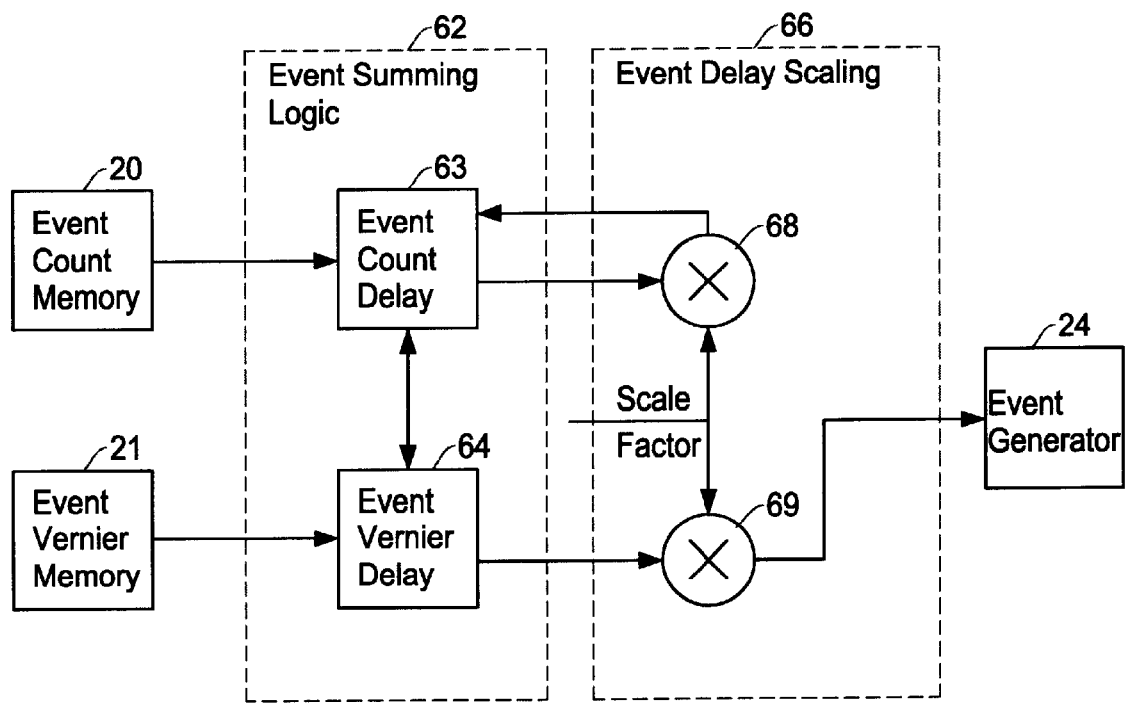
FIG. 8 is a schematic block diagram showing an example of circuit structure of an integral post-scaling applied in an event test system in which a scale factor includes only an integral component.

FIG. 8 is a block diagram showing another basic structure of the post-scaling as applied in an event test system. In this example, the scale, factor for the multiplication operation contains only an integer component. The integer based post-scaling produces no fractional component in the event count scaling to be added to the result of the vernier delay scaling. This is because both the delay data from the event count delay logic 63 and the scale factor are integer numbers of the event clock. In contrast, the event vernier delay is a value less than one event clock cycle in length. Thus, scaling this value with an integer scale factor may still produce a result with a fractional component. The scaled vernier delay may also exceed one reference clock cycle in length. Thus, similar to the case of the fractional scaling of FIG. 7, an integral number in the result of the vernier scaling must be added to the integral part delay of the event count delay by the adder 67. Then, the integral part delay and the fractional part delay at the output of the adder 67 are provided to the event generator 24.

Figure 9:
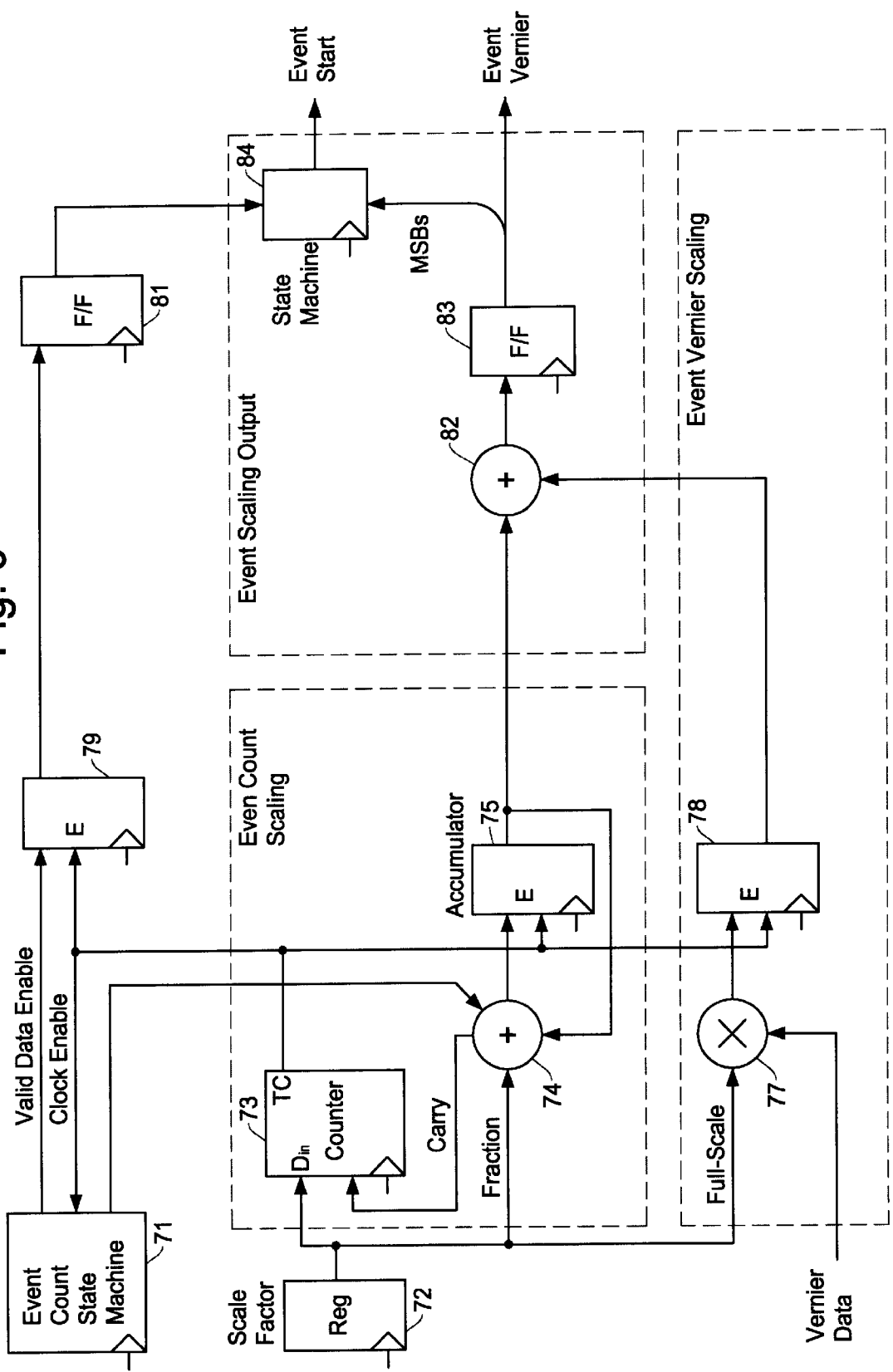
FIG. 9 is a block diagram showing a more detailed embodiment of a fractional post-scaling for an event test system in which a scaling factor contains both an integer component and a fractional component.

FIG. 9 shows a more specific example of post-scaling using a scaling factor containing both an integer component and a fractional component. An event count state machine 71 corresponds, in part, to the event count delay 53 in the event summing logic 52 of FIG. 7. The event count state machine 71 produces a valid data enable based on an integral part of delay data accumulated throughout all of the previous events as will be described later. A register 72 stores the scale factor which is, in this example, comprised of an integer component and a fractional component.

The implementation of FIG. 9 basically formed with an event count scaling, an event vernier scaling, and an event scaling output. The event count scaling roughly corresponds to the multiplier 58 in FIG. 7 and the event vernier scaling roughly corresponds to the multiplier 59 in FIG. 7. Further, the event scaling output roughly corresponds to the adder 57 in FIG. 7. The valid data enable from the state machine 71 produced based on the accumulated event count data is sent to the event scaling output through a register 79 and a flip-flop 81 thereby producing an event start signal which is an integer part of the final delay. The event scaling output also produces event vernier data showing the fractional part of the final delay which is a delay timing relative to the event start signal.

The scale factor from the register 72 is provided to the event count scaling and the event vernier scaling in FIG. 9. The event count scaling includes a scaling counter 73, an accumulator formed with an adder 74 and a register 75. The event vernier scaling includes a multiplier 77 and a register 78. The event scaling output includes an adder 82, a flip-flop 83 and a state machine 84. Although not specifically shown, the reference clock is commonly provided to each circuit component of FIG. 9.

In this example, in the event count scaling, the fractional component of the scale factor is provided to the adder 74 while the integral component of the scale factor is provided to the counter 73. In the event vernier scaling, the full-scale value (integral and fractional components) of the scale factor is provided to the multiplier 77. The vernier data from the event vernier memory is provided to the multiplier 77 to be multiplied by the scale factor.

The integral component of the scale factor presets the scaling counter 73, so that a terminal count (TC) pulse is generated from the scaling counter 73 every time when the counted value reaches the preset value. For example, when the integral component of the scale factor shows "3", the scaling counter 73 generates the terminal count pulse every time when counting three pulses of the reference clock. The terminal count pulse is provided to the event count state machine 71 as a clock enable signal so that the valid data enable is produced when the number of terminal count pulses reaches the accumulated event count value specified in the state machine 71.

The terminal count pulse from the scaling counter 73 is also supplied to the registers 75 and 78. As noted above, since the register 75 and the adder 74 form the accumulator, the fractional component of the scale factor is added to the previous fractional component every time when the terminal count pulse is received by the register 75. In the case where the accumulated fractional component exceeds an integer number such as "1", i.e., one reference clock cycle, a resultant carry signal is received by the scaling counter 73 to add an extra delay of one reference clock cycle before generating the terminal count pulse therefrom.

In the vernier event scaling, the register 78 transmits the vernier value, resulted from multiplying the vernier data by the scale factor, to the adder 82 in the event scaling output. Thus, the adder 82 in the event scaling output adds the accumulated fractional component from the register (accumulator) 75 to the scaled vernier data from the register 78. In the case where the result of summing produces an overflow, i.e., an integer number, the most significant bit (MSB) showing such an integer number is provided to the state machine 84 to add an extra delay defined by the integer number. Based on the timing defined by the extra delay, the state machine 84 issues the valid data enable or an event start signal which is provided to the event generator such as shown in FIG. 7. The fractional component of the scaled event vernier is produced by the event scaling output which is also provided to the event generator.

Figure 10:
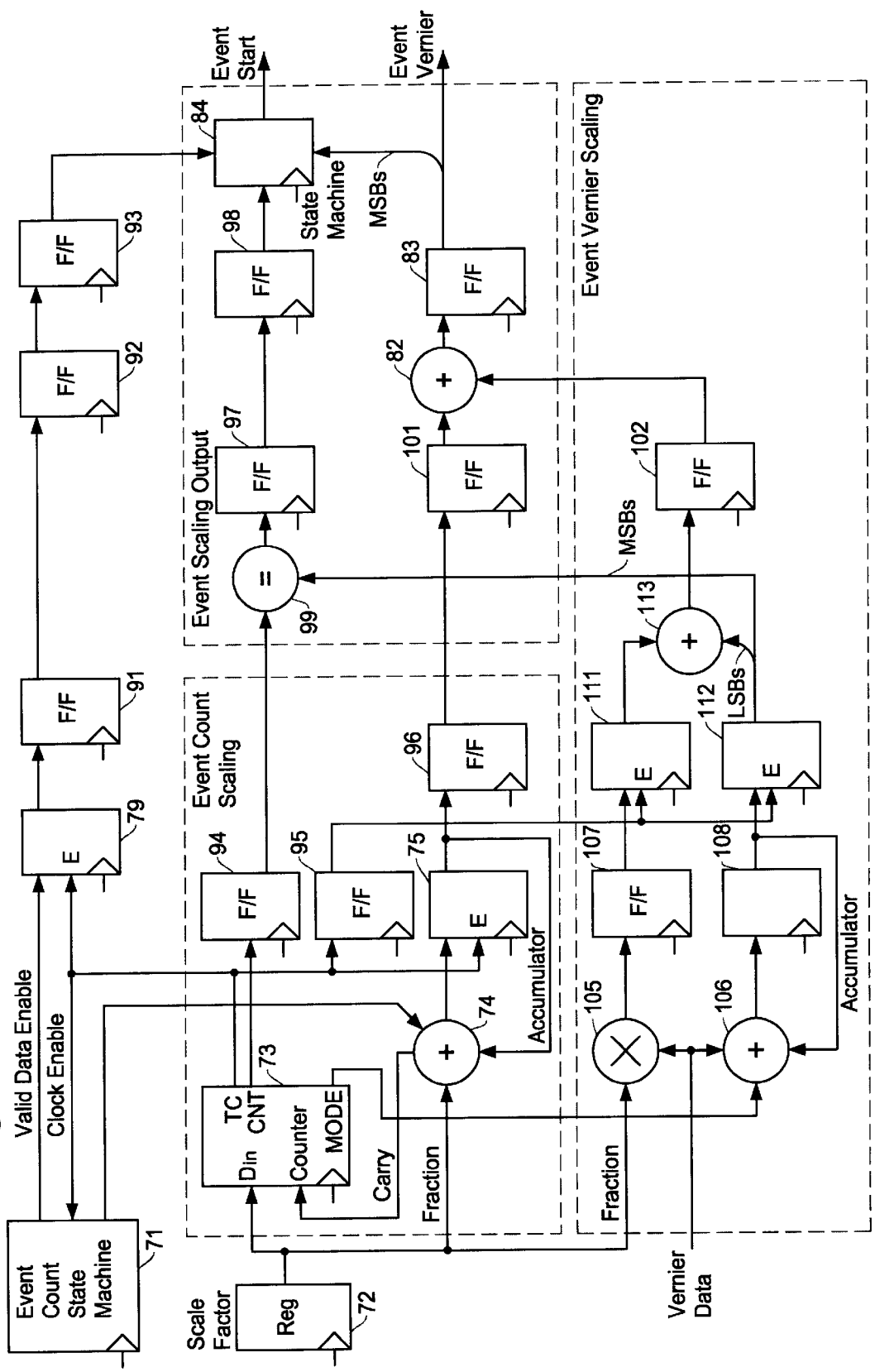
FIG. 10 is a block diagram showing another embodiment of a fractional post-scaling for an event test system in which a scaling factor contains both an integer component and a fractional component.

FIG. 10 is a block diagram showing another example of a fractional post-scaling implemented in an event test system in which a scaling factor contains both an integer component and a fractional component. As in the foregoing, the implementation of FIG. 9 incorporates the multiplier 77 which is provided with the full-scale value of the scale factor. Accordingly, the multiplication operation of such a full-scale value may require a large amount of logic to implement. An alternative approach of FIG. 10 breaks the vernier multiplication into an integer operation and a fractional operation in the event vernier scaling.

The event count state machine 71 and the event count scaling in FIG. 10 is the same as that of FIG. 9 and produces a valid data enable based on an integral part of delay data accumulated throughout all of the previous events. The valid data enable is transmitted through flip-flops 79 and 91–93 to the state machine 84 in the event scaling output to produce the event start signal. The register 72 stores the scale factor which is comprised of an integer component and a fractional component.

The event count scaling in FIG. 10 is different from that of FIG. 9 in that the scaling counter 73 provides count data CNT to a comparator 99 in the event scaling output. Another difference in the event count scaling is that the scaling counter 73 provides a mode control (MODE) to an accumulator in the event vernier scaling. As in the example of FIG. 9, an adder 74 and a register 75 form an accumulator. The event count scaling includes additional flip-flops 94–96 for a retiming purpose relative to the additional components in the event vernier scaling.

The event vernier scaling includes a multiplier 105, a flip-flop 107, a register 111, a vernier accumulator formed by an adder 106 and a register 108, a flip-flop 112, an adder 113, and a flip-flop 102. The accumulator receives the mode control signal from the scaling counter 73. The vernier data from the event vernier memory is provided to the multiplier 105 and to the adder 106 (vernier accumulator). The multiplier 105 also receives the fractional component of the scale factor from the register 72.

The event scaling output includes the comparator 99 and the state machine 84 as noted above and an adder 82, and flip-flops 83, 97, 98 and 101. The comparator 99 receives the count data CNT from the scaling counter 73 and an overflow signal which is derived from the most significant bits (MSBs) of the accumulated vernier data from the vernier scaling and compares therebetween. The state machine 84 produces an event start signal when receiving both the valid data enable from the event count state machine 71 and the output (integer delay enable) of the comparator 99. The event start signal is delayed by one reference clock cycle when the result of summing by the adder 82 involves a carry signal (MSB). If a carry signal represents the number greater than one, i.e., a multiple bits of MSBs, the corresponding number of clock cycles will be added before generating the event start signal.

In FIG. 10, the scale factor from the register 72 is provided to the event count scaling and the event vernier scaling as noted above. In this example, in the event count scaling, the fractional component of the scale factor is provided to the adder 74 (accumulator) while the integral component of the scale factor is provided to the scaling counter 73. In the event vernier scaling, unlike the example of FIG. 9, only the fractional component of the scale factor is provided to the multiplier 105. The vernier data from the event vernier memory is provided to the multiplier 105 to be multiplied by the fractional component of the scale factor. Further, the vernier data is also provided to the vernier accumulator (adder 106) to be accumulated for the number of times defined by the integral component of the scale factor at each reference clock cycle.

The integral component of the scale factor presets the scaling counter 73 so that a terminal count (TC) pulse is generated therefrom every time when the counted value reaches the preset value. For example, when the integral component of the scale factor is "3", the scaling counter 73 generates the terminal count pulse every time when counting three pulses of the reference clock. The terminal count pulse is provided to the event count state machine 71 as a clock enable so that the valid data enable is produced when the number of terminal count pulses reaches the accumulated event count value specified in the state machine 71.

The terminal count pulse from the scaling counter 73 is also supplied to the register 75. As noted above, since the register 75 and the adder 74 are forming the accumulator, the fractional component of the scale factor is added to the previous fractional component every time when the terminal count pulse is received by the register 75. In the case where the accumulated fractional component exceeds an integer number such as "1" (one reference clock cycle), a resultant carry signal is received by the scaling counter 73 to add an extra delay of one reference clock cycle before generating the terminal count pulse therefrom.

In the vernier event scaling, as noted above, the vernier data from the event vernier memory is provided to the multiplier 105 to be multiplied by the fractional component of the scale factor. Because the multiplier 105 deals with only the fractional component of the scale factor, the number of bits associated with the multiplication can be reduced relative to the multiplier 77 of FIG. 9. The vernier data is also accumulated at each reference clock cycle by the vernier accumulator formed with the adder 106 and the register 108. The vernier accumulator calculates the integer portion of the vernier multiplication based on the fact that the integer multiplication simply consists of adding a value by an integer number of time.

The mode control (MODE) signal from the scaling counter 73 initializes the vernier accumulator at the beginning of each scale count operation in the scaling counter 73. Namely, in the foregoing example where the integer component of the scale factor to the scaling counter 73 is "3", a mode control signal is generated at each three reference clock cycles. The mode control signal resets the vernier accumulator. An overflow (MSBS) of the vernier accumulator is provided to the comparator 99 wherein it is compared with the count data from the scaling counter 73. The result of the comparison (integer delay enable) is provided to the state machine 84 to determine the delay time of the valid data enable.

The accumulated vernier data and the multiplied vernier data are added by the adder 113 and the result of which is provided to adder 82 in the event scaling output. The adder 82 in the event scaling output adds the accumulated fractional component of the event count data from the register 75 to the scaled vernier data from the adder 113. In the case where the result of summing by the adder 82 produces an overflow, i.e., an integer number, the most significant bits (MSBs) showing such an integer number is provided to the state machine 84 to add an extra delay defined by the integer number. Based on the delay time defined by the output of the comparator 99 and the extra delay defined by the MSBs, the state machine 84 produces an event start signal which is provided to the event generator.

Figure 11:
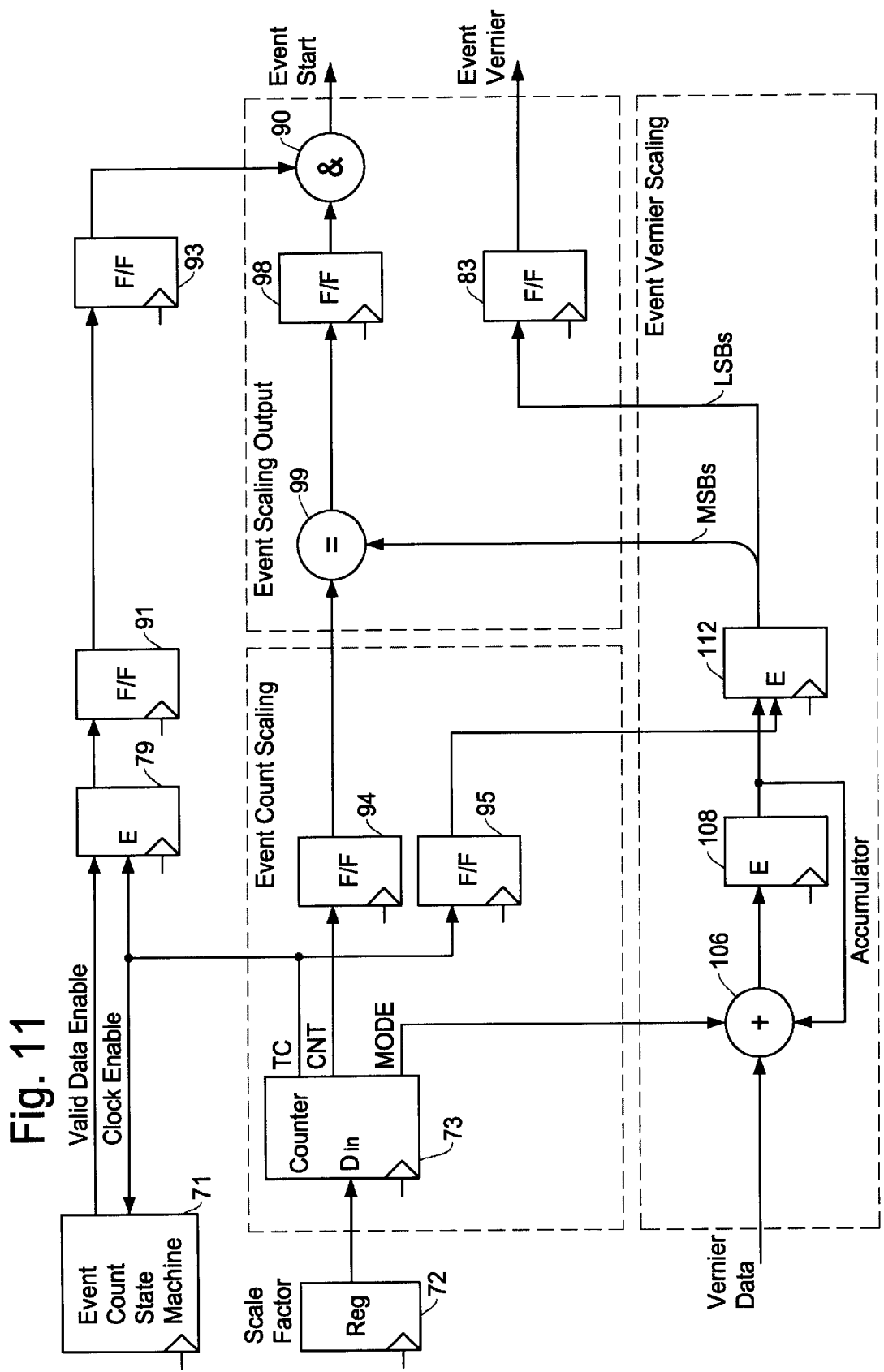
FIG. 11 is a block diagram showing an embodiment of an integer post-scaling implemented in an event test system in which a scaling factor contains only an integer component.

FIG. 11 is a block diagram showing a further example of a post-scaling structure implemented in an event test system in which a scaling factor contains only an integer component. The implementation of FIG. 11 is a simpler version of the implementation of FIG. 10 because it does not involve the scaling operation for a fractional component of the scale factor. FIGS. 12A–12G are timing charts showing the scaling operation of FIG. 11.

In FIG. 11, since the scale factor includes only an integer component, the accumulator in the event count scaling of FIG. 10 is not incorporated in this embodiment. The event count state machine 71 increments in synchronism with the terminal count (TC) pulse from the scaling counter 73 and produces a valid data enable based on an integral part of the delay data accumulated throughout all of the previous events. The valid data enable is transmitted through flip-flops 79, 91 and 93 to an AND circuit 90 in the event scaling output to produce an event start signal.

In the event count scaling of FIG. 11, the scaling counter 73 transfers the count data CNT to a comparator 99 in the event scaling output. The event vernier scaling of FIG. 11 includes a vernier accumulator formed with an adder 106 and a register 108. The scaling counter 73 provides the mode control (MODE) signal to the vernier accumulator in the event vernier scaling to reset the vernier accumulator. The vernier data from the event vernier memory is provided to the vernier accumulator.

The event scaling output of FIG. 11 includes a comparator 99 which receives the count data from the scaling counter 73 and a carry signal (MSBs) of the accumulated vernier data from the vernier scaling and compares the data therebetween. The AND circuit 90 produces an event start signal when receiving both the valid data enable from the event count state machine 71 and the output (integer delay enable) of the comparator 99. The event start signal is delayed by one reference clock cycle when the result of summing by the adder 82 involves a carry signal (MSB). As noted above, if a carry signal represents the number greater than one, i.e., a multiple bits of MSBs, the corresponding number of clock cycles will be added before generating the event start signal.

Referring back to the event count scaling, the scale factor formed of only the integral component is provided to the scaling counter 73. The scale factor from the register 72 presets the scaling counter 73 so that the terminal count (TC) pulse is generated every time when the counted value reaches the preset integer number. For example, when the scale factor is "3", the counter 73 generates the terminal count pulse every time when counting three pulses of the reference clock. The event count state machine 71 advances at each terminal count pulse so that the valid data enable is produced when the number of terminal count pulses reaches the accumulated event count value specified therein.

In the vernier event scaling, as noted above, the accumulator formed by the adder 106 and the register 108 receives the vernier data from the event vernier memory. The vernier data is accumulated at each reference clock cycle for the number of times defined by the integer number of the scale factor. This is because the integer multiplication simply consists of adding the vernier data by the integer number of times.

Such an accumulation is performed under the control of mode control (MODE) signal from the scaling counter 73 which initializes the accumulator at the beginning of each scale count operation. In the foregoing example wherein the integer component to the scaling counter 73 is "3", a mode control signal is generated at each three reference clock cycles, which resets the accumulator. As a consequence, the accumulator adds the vernier data three times, i.e., the integer number of times specified by the scale factor. An overflow (MSBs) of the accumulated vernier is provided to the comparator 99 wherein it is compared with the count data from the scaling counter 73. The result of the comparison is provided to the AND circuit 90 to determine the delay time of the valid data enable. The fractional part of the accumulated vernier is produced at the output of the event scaling output.

The foregoing operation in the embodiment of FIG. 11 is further explained with reference to the timing charts of FIGS. 12A–12G. In this example, it is assumed that the scale factor is an integer number "3", i.e., the original delta time of the current event is expanded by three times. Thus, the scaling counter 73 produces a terminal count pulse at each three counts of the reference clock of FIG. 12A. It is also assumed that the event count state machine 71 of FIG. 11 is to generate the valid data enable when it receives three enable pulses, i.e., three terminal count pulses. Consequently, the valid data enable of FIG. 12F is produced by the event count state machine 71. The scaling counter 73 also produces the count data (scale cycle count) of FIG. 12B in synchronism with the reference clock. The count data is provided to the comparator 99 in FIG. 11.

Figure 12A:
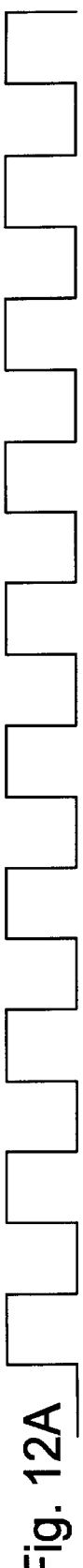
FIGS. 12A–12G are timing charts showing a scaling operation of the integer post-scaling shown in the implementation of FIG. 11.
Figure 12B:
Figure 12C:
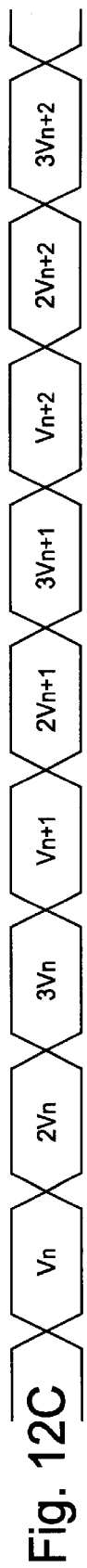
Figure 12D:
Figure 12E:
Figure 12F:
Figure 12G:

The vernier accumulator in the event vernier scaling adds the vernier data the number of times defined by the scale factor, three times in this case, as shown in FIG. 12C. The mode control signal from the scaling counter 73 resets the accumulator at every three reference clocks before starting the accumulation operation. Because the accumulated vernier data is enabled in the register 112 by the terminal count pulse from the scaling counter 73, the event vernier scaling produces the accumulated vernier data of FIG. 12D to be provided to the event generator. The comparator 99 compares the count data (scale cycle count) from the scaling counter 73 and the most significant bits (MSBs) of the accumulated vernier data and produces a match signal (integer delay enable) of FIG. 12E when both data match with one another. Thus, the AND circuit 90 generates an event start signal of FIG. 12G, for the event generator, in synchronism with the timing when receiving both the valid data enable of FIG. 12F and the match signal of FIG. 12E.

Figure 13:
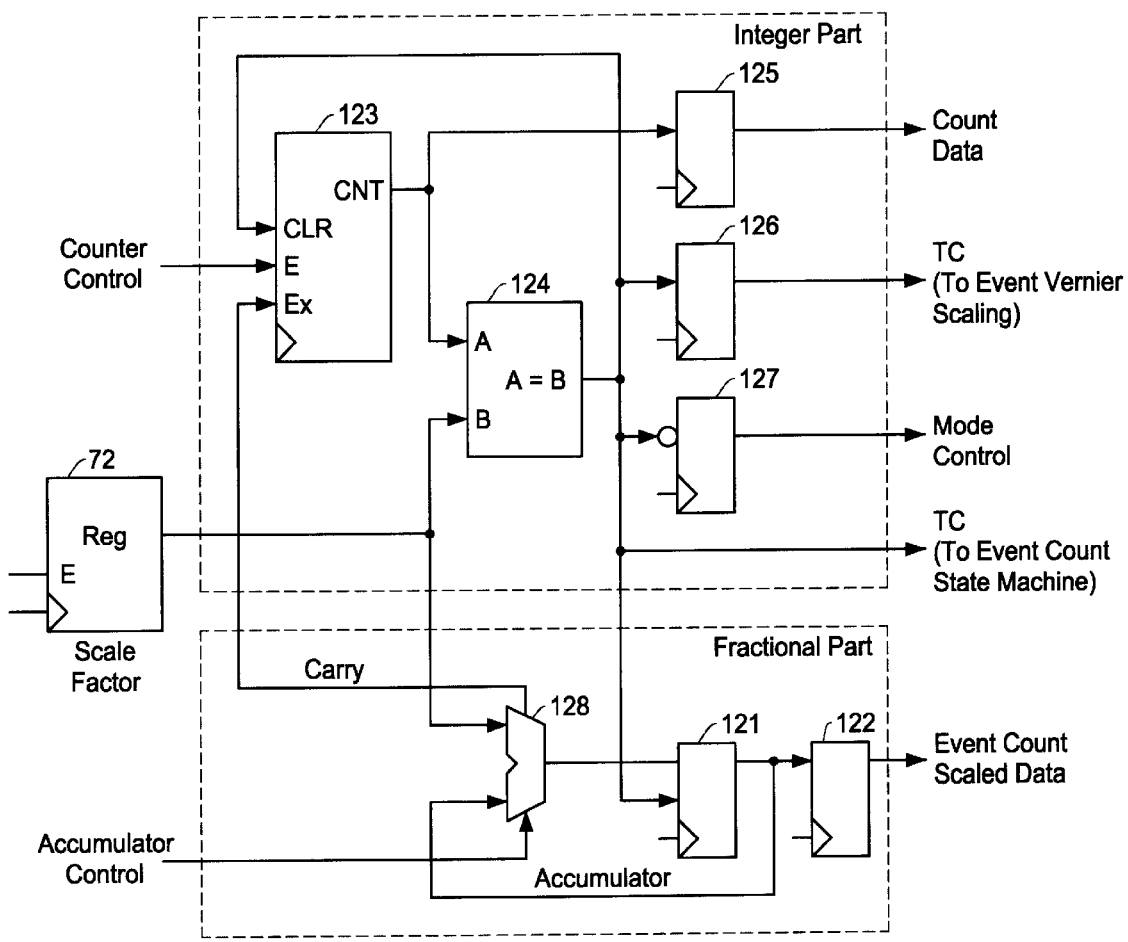
FIG. 13 is a block diagram showing a structure and operation of the event count scaling used in the fractional post-scaling of FIG. 9 and FIG. 10.

FIG. 13 is a block diagram showing an example of the event count scaling in the fractional post-scaling such as shown in FIG. 10. This block diagram shows that the integer part of the event count scaling consists of a scaling counter 123 and a comparator 124. The scaling counter 123 is an up-counter that inserts an integer number of wait states into the event count logic based on the size of the scale factor's integer component. The comparator 124 compares the integer component of the scale factor from the register 72 and the count data from the counter 123. When the both data match with one another, the comparator 124 generates a match signal or a terminal count (TC). The event count state machine such as shown in FIG. 10 may not proceed until the comparator 124 issues the terminal count. The count data (scale cycle count) of the scaling counter 123 is provided to the event scaling output where it is used to determine the correct delay for producing an integer delay enable (match signal by the comparator 99 of FIG. 10).

The fractional part of the event count scaling consists of an accumulator formed with an arithmetic unit 128 and a register 121. The accumulator receives the fractional component of the scale factor and adds the fractional component at every terminal count pulse. A carry signal resulted from this accumulation is passed back to the scaling counter 123 to insert one additional reference clock delay. The accumulated data is provided to the event scaling output to be used in the final vernier data calculation.

Figure 14:
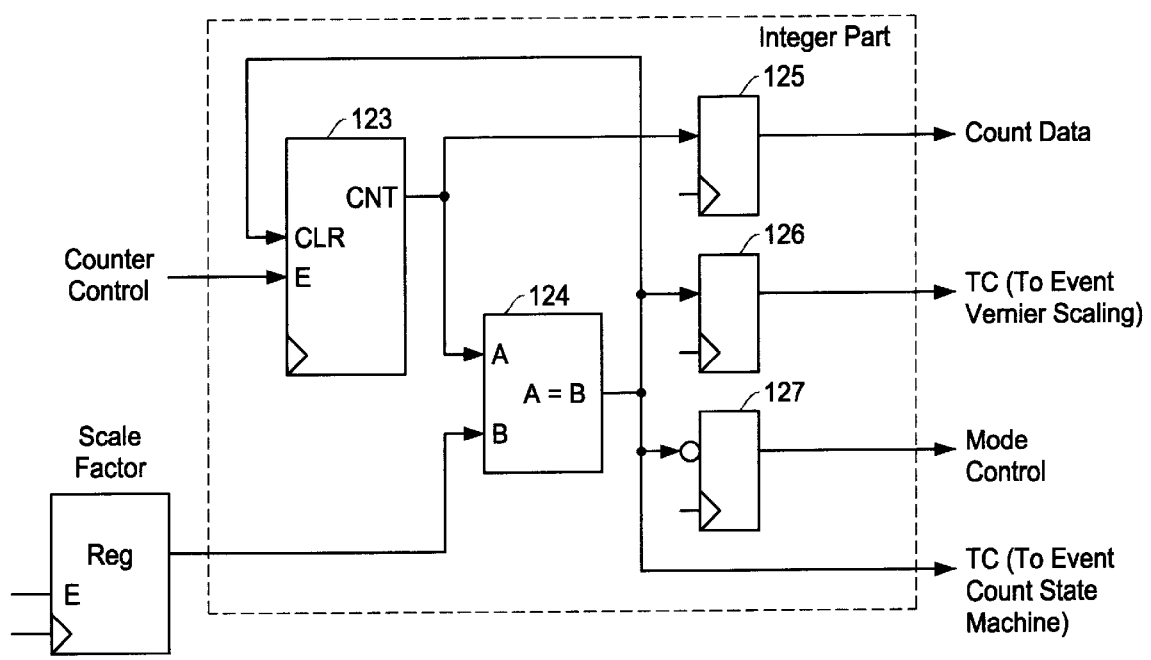
FIG. 14 is a block diagram showing a structure and operation of the event count scaling used in the integer post-scaling of FIG. 11.

FIG. 14 is a block diagram showing a further example of an event count scaling to be used in the integer post-scaling such as shown in FIG. 11. This example is for the integer scaling for the event count in which the scale factor is comprised of only an integer number. The structure of FIG. 14 is similar to that of FIG. 13 directed to the fractional event count scaling. The basic difference lies with the removal of all the fractional components in the delay operation. For example, there is no accumulator for the fractional component of the scale factor.

Figure 15:
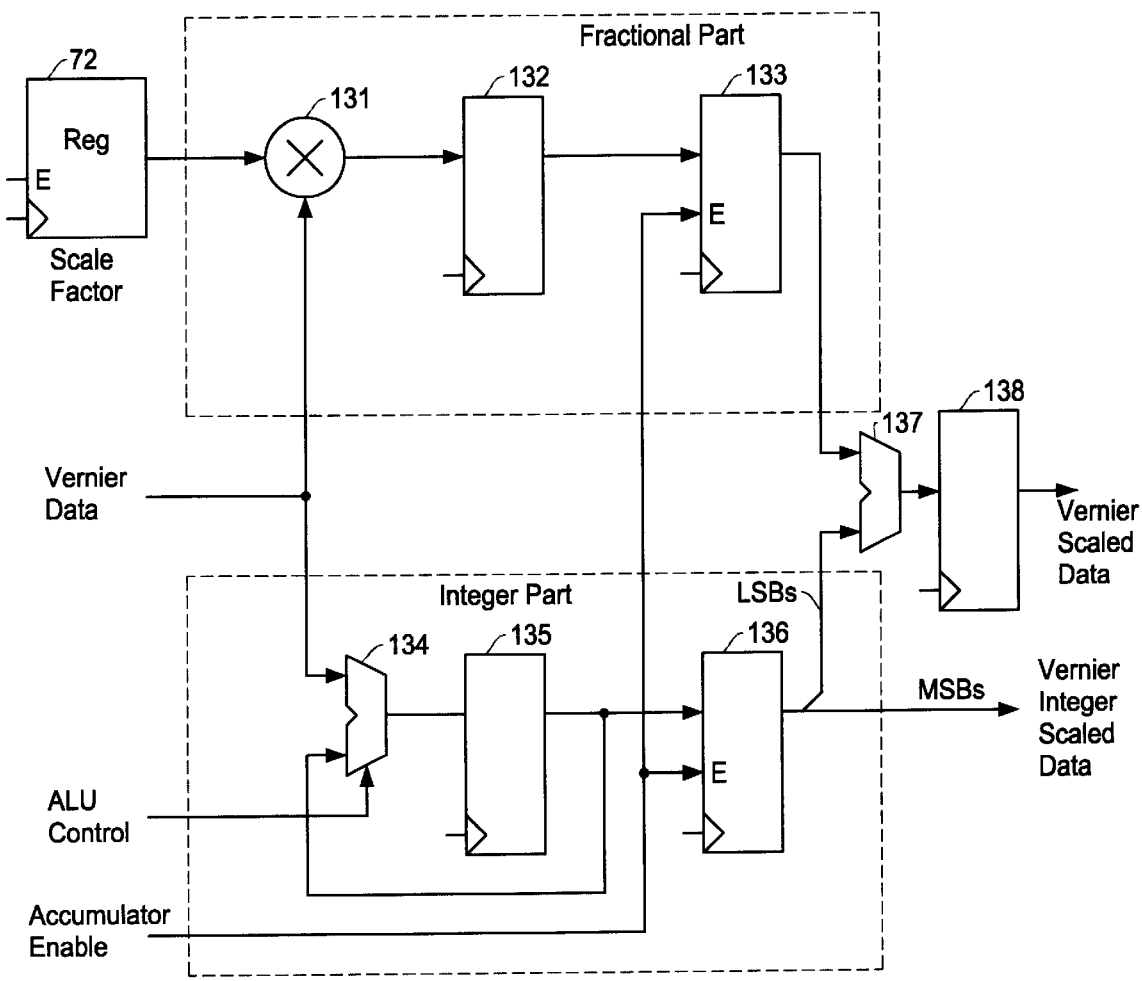
FIG. 15 is a block diagram showing a structure and operation of the event vernier scaling used in the fractional post-scaling of FIG. 9 and FIG. 10.

FIG. 15 is a block diagram showing an example of the event vernier scaling to be used in the fractional post-scaling such as shown in FIG. 10. The structure of FIG. 15 is basically the same as that of the event vernier scaling in FIG. 10. The block diagram consists of a fractional part and an integer part. The fractional part of the vernier scaling shows a multiplier 131 which receives a fractional portion of the scale factor and multiply the same by the vernier data. As in the foregoing with reference to FIG. 10, since only the fractional portion of the scale factor is used in the multiplier 131, the associated logic may be smaller than that required for the full-scale multiplication such as shown in FIG. 9.

The integer part of the vernier scaling consists of an accumulator formed with an arithmetic unit 134 and a register 135. The integer part also includes a clock enabled register 136 controlled by an accumulator enable signal. The accumulator will accumulate for the integer number of reference clocks in each integer number of the scale factor (terminal count). An ALU control resets the accumulator at the end of each terminal count or mode control signal of FIG. 10. An accumulator enable allows the clock enable register 136 to store the final, scaled vernier value at each terminal count.

The result of the integer part vernier scaling represents both an integer delay value and a remaining fractional delay value. The integer delay value represents an integer number of reference clocks and the fractional delay value represents a remaining fraction of the reference clock. The fractional reference clock delay is added by an arithmetic unit 137 to the result of the fractional part of the event vernier scaling to produce the vernier scaled data. The overflow in the accumulated vernier is sent to the comparator 99 of FIG. 10.

Figure 16:
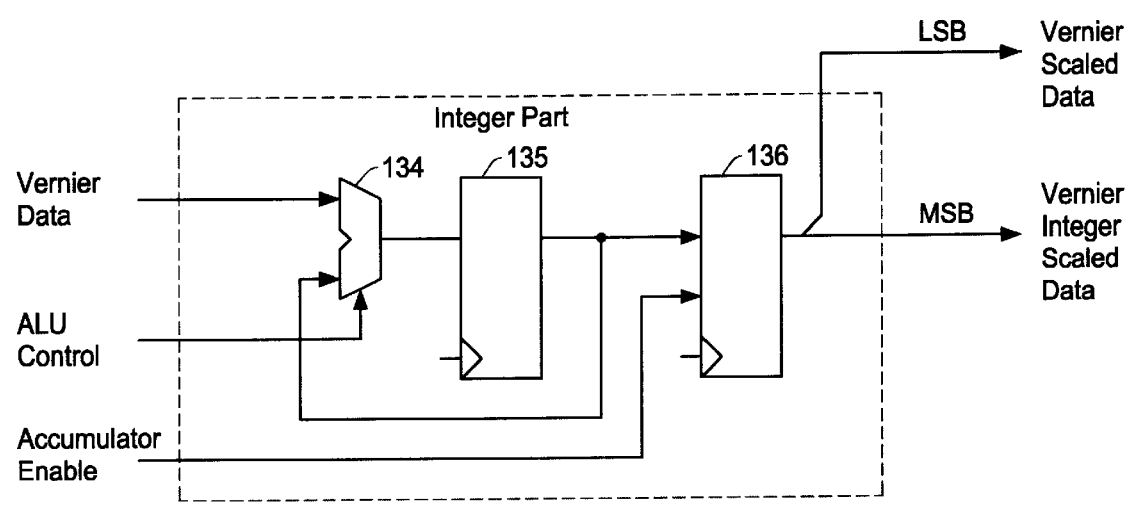
FIG. 16 is a block diagram showing a structure and operation of the event vernier scaling used in the integer post-scaling of FIG. 11.

FIG. 16 is a block diagram showing a showing a further example of an event vernier scaling to be used in the integer post-scaling of FIG. 11. This example is for event vernier integer scaling in which the scale factor is comprised of only an integer number. The structure of FIG. 16 is similar to that of FIG. 15 for the fractional event count scaling. The basic difference lies with the removal of all the fractional components in the delay operation. For example, there is no multiplier for fractional component of the scale factor.

According to the present invention, the event based semiconductor test system is capable of producing the events of various timings based on the event data stored in the event memory to evaluate the semiconductor device. The timing of each of the events is defined by a difference of time length (delta time) from the last event. The delta time between events is also defined by a combination of an integer multiple of a reference clock period and a fraction of the reference clock period. The event test system of the present invention is capable of scaling the delay times (delta times) for producing the current events by modifying the delay times of the current events based on a scale factor. The scaling operation in the event test system of the present invention is performed based on the scale factor having both an integer component and a fractional component. In another aspect, the scaling operation in the event test system is performed based on the scale factor having only an integer component.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event based test system for testing an electronics device under test (DUT) by supplying a test signal to the DUT and evaluating an output of the DUT at a timing of a strobe signal, comprising:

an event memory configured by an event count memory for storing event count data of timing data which is formed with an integer multiple of a reference clock period (integral part data), and an event vernier memory for storing event vernier data of the timing data which is formed with a fraction of the reference clock period (fractional part data), wherein the timing data represents a time difference between two adjacent events;

an address sequencer for generating address data for accessing the event memory to read out the timing data therefrom;

a summing and scaling logic for summing the timing data of previous events and a current event from the event memory and to produce an overall time of the current event relative to a predetermined reference point, the summing and scaling logic scaling the timing data thereby changing the overall time of the current event in proportion to a scale factor, wherein the summing and scaling logic includes a delay means for providing an additional delay of one reference clock period every time when a sum of a fractional part incorporated in the summing and scaling operation exceeds the reference clock period;

an event generator circuit for generating each event based on the overall time for formulating the test signal or strobe signals; and a host computer for controlling an overall operation of the event based test system through a test program.

2. An event based test system as defined in claim 1, wherein the summing and scaling logic includes;

an event count scaling logic for scaling the event count data based on the scale factor;

an event vernier scaling logic for scaling the vernier data from the event vernier memory based on the scale factor;

an event count state machine for producing an output signal in response to a terminal count pulse produced in response to an integer component of the scale factor from the event count scaling logic; and an event scaling output logic for calculating an overall scaled delay of the current event based on scaled data from the event count scaling logic, scaled data from the vernier scaling logic and the output signal from the event count state machine.

3. An event based test system as defined in claim 2, wherein the scale factor for scaling the timing data is formed of an integer component and a fractional component.

4. An event based test system as defined in claim 3, wherein the event count scaling logic is comprised of:

a scaling counter which is provided with the integer component of the scale factor for counting the reference clock for the number of times specified by the integer component of scale factor and generating a terminal count pulse every time when counting the reference clock by the specified number of times; and an accumulator which is provided with the fractional component of the scale factor for accumulating the fractional component every time when receiving the terminal count pulse from the scaling counter;

wherein a carry signal is produced by the accumulator when the accumulated data exceeds one cycle length of the reference clock for providing an additional delay of one reference clock cycle to the scaling counter to include the additional delay before generating the terminal count pulse.

5. An event based test system as defined in claim 4, wherein the event vernier scaling logic is comprised of:

a multiplier which is provided with the vernier data from the event vernier memory for multiplying the vernier data by the scale factor having both the integer component and the fractional component.

6. An event based test system as defined in claim 5, wherein the event scaling output logic is comprised of:

an adder for summing the accumulated data from the accumulator in, the event count scaling logic and the multiplied data from the multiplier in the event vernier scaling logic; and a state machine which is provided with the output signal from the event count state machine for producing an event start signal which is sent to the event generator;

wherein a carry signal is produced by the adder when the summed data exceeds one cycle length of the reference clock for providing an additional delay of one reference clock cycle to the state machine to include the additional delay before generating the event start signal.

7. An event based test system as defined in claim wherein the accumulator in the event count scaling logic for scaling the event count data is comprised of an arithmetic unit and a register, and the vernier accumulator in the event vernier scaling logic for scaling the vernier data is comprised of an arithmetic unit and a register.

8. An event based test system as defined in claim 2, wherein the scale factor for scaling the timing data is formed solely of an integer component.

9. An event based test system as defined in claim 8, wherein the event count scaling logic is comprised of a scaling counter which is provided with the scale factor for counting the reference clock for the number of times specified by the scale factor and generating a terminal count pulse and a mode control signal every time when counting the reference clock by the specified number of times, the scaling counter further producing count data in synchronism with the reference clock.

10. An event based test system as defined in claim 9, wherein the event vernier scaling logic is comprised of a vernier accumulator for accumulating the vernier data at the timing of the reference clock for a number of times specified by the integer component of the scale factor wherein the vernier accumulator is reset by the mode control signal from the scaling counter.

11. An event based test system as defined in claim 10, wherein the event scaling output logic is comprised of:

a comparator which is provided with the count data from the scaling counter in the event count scaling logic for comparing the same with an overflow data from the vernier accumulator in the event vernier scaling logic and producing a match signal when both data match with one another; and an AND circuit which is provided with the output signal from the event count state machine and the match signal from the comparator for producing an event start signal which is sent to the event generator.

12. An event based test system as defined in claim 3, wherein the event count scaling logic is comprised of:

a scaling counter which is provided with the integer component of the scale factor for counting the reference clock for the number of times specified by the integer component of scale factor and generating a terminal count pulse and a mode control signal every time when counting the reference clock by the specified number of times, the scaling counter further producing count data in synchronism with the reference clock; and an accumulator which is provided with the fractional component of the scale factor for accumulating the fractional component every time when receiving the terminal count pulse from the scaling counter;

wherein a carry signal is produced by the accumulator when the accumulated data exceeds one cycle length of the reference clock for providing an additional delay of one reference clock cycle to the scaling counter to include the additional delay before generating the terminal count pulse.

13. An event based test system as defined in claim 12, wherein the event vernier scaling logic is comprised of:

a multiplier which is provided with the vernier data from the event vernier memory for multiplying the vernier data by the scale factor having both the integer component and the fractional component;

a vernier accumulator for accumulating the vernier data at the timing of the reference clock for a specified number of times defined by the integer component of the scale factor, the vernier accumulator being reset by the mode control signal from the scaling counter; and an adder for summing the accumulated vernier data from the vernier accumulator and the multiplied vernier data from the multiplier.

14. An event based test system as defined in claim 13, wherein the event scaling output logic is comprised of:

an adder for summing the accumulated data from the accumulator in the event count scaling logic and the summed data from the adder in the event vernier scaling logic;

a comparator which is provided with the count data from the scaling counter in the event count scaling logic for comparing the same with an overflow data from the vernier accumulator in the event vernier scaling logic and producing a match signal when both data match with one another; and a state machine which is provided with the output signal from the event count state machine and the match signal from the comparator for producing an event start signal for the event generator;

wherein a carry signal is produced by the adder when the summed data exceeds one cycle length of the reference clock for providing an additional delay of one reference clock cycle to the state machine to include the additional delay before generating the event start signal.

15. An event based test system as defined in claim 14, wherein the accumulator in the event count scaling logic for scaling the event count data is comprised of an arithmetic unit and a register, and the vernier accumulator in the event vernier scaling logic for scaling the vernier data is comprised of an arithmetic unit and a register.

16. An event based test system as defined in claim 1, further comprising a failure memory for storing test result information of said DUT detected by applying said test signals to said DUT and comparing response outputs of said DUT with expected value at the timing of said strobe signals.

17. An event based test system as defined in claim 1, further comprising a pin electronics between said event generation circuit and said DUT for supplying the test signals to the DUT and receiving the output of the DUT.

* * * * *